(12) United States Patent
Tauber et al.

(10) Patent No.: US 12,028,974 B2
(45) Date of Patent: Jul. 2, 2024

(54) CERAMIC CARRIER SUBSTRATE AND POWER MODULE

(71) Applicant: Robert Bosch GmbH, Stuttgart (DE)

(72) Inventors: Peter Tauber, Tuebingen (DE); Josef Weber, Reutlingen (DE); Ralf Winkler, Reutlingen (DE)

(73) Assignee: ROBERT BOSCH GMBH, Stuttgart (DE)

(*) Notice: Subject to any disclaimer, the term of this patent is extended or adjusted under 35 U.S.C. 154(b) by 156 days.

(21) Appl. No.: 17/789,124

(22) PCT Filed: Feb. 4, 2021

(86) PCT No.: PCT/EP2021/052616
§ 371 (c)(1),
(2) Date: Jun. 24, 2022

(87) PCT Pub. No.: WO2021/160503
PCT Pub. Date: Aug. 19, 2021

(65) Prior Publication Data
US 2023/0051374 A1  Feb. 16, 2023

(30) Foreign Application Priority Data
Feb. 14, 2020 (DE) .............. 10 2020 201 870.7

(51) Int. Cl.
*H05K 1/03* (2006.01)
*H05K 1/02* (2006.01)
*H05K 3/46* (2006.01)

(52) U.S. Cl.
CPC ......... *H05K 1/0306* (2013.01); *H05K 1/0201* (2013.01); *H05K 1/0265* (2013.01);
(Continued)

(58) Field of Classification Search
CPC .. H05K 1/0306; H05K 1/0201; H05K 1/0265; H05K 3/4667
See application file for complete search history.

(56) References Cited

U.S. PATENT DOCUMENTS 3,622,257 A   11/1971   Hein et al.
7,332,805 B2   2/2008   Natarajan et al.
(Continued)

FOREIGN PATENT DOCUMENTS

DE   3930858 A1   3/1990
DE   102013226513 A1   6/2015
(Continued)

OTHER PUBLICATIONS

International Search Report for PCT/EP2021/052616, dated May 6, 2021.

*Primary Examiner* — Jeremy C Norris
(74) *Attorney, Agent, or Firm* — NORTON ROSE FULBRIGHT US LLP; Gerard A. Messina

(57) ABSTRACT

A ceramic carrier substrate for an electrical/electronic circuit. The substrate includes ceramic layers arranged one above the other in an interconnected structure and conductor tracks arranged on and/or in individual ceramic layers and connected to one another as the conductor structure for the electrical/electronic circuit. The interconnected structure is formed by a firing operation. A first conductor substructure is formed in a first interconnected structure subassembly which comprises at least one of the ceramic layers, and a second conductor substructure is formed in a second interconnected structure subassembly which is directly adjacent to the first interconnected structure subassembly and comprises at least one of the ceramic layers. The second conductor substructure substantially consists of high-current conductor tracks and is configured to contact a power circuit.

(Continued)

The first conductor substructure substantially consists of signal conductor tracks and is configured to contact a drive circuit for the power circuit.

19 Claims, 2 Drawing Sheets

(52) U.S. Cl.
CPC ... *H05K 3/4667* (2013.01); *H05K 2201/0195* (2013.01); *H05K 2201/0352* (2013.01); *H05K 2201/066* (2013.01)

(56) References Cited

U.S. PATENT DOCUMENTS

| | | |
|---|---|---|
| 2003/0020173 A1 | 1/2003 | Huff et al. |
| 2012/0305296 A1 | 12/2012 | Gordon et al. |

FOREIGN PATENT DOCUMENTS

| | | |
|---|---|---|
| DE | 102015209058 A1 | 11/2016 |
| DE | 102018212272 A1 | 1/2020 |
| JP | H058456 A | 1/1993 |
| JP | 2004253579 A | 9/2004 |
| JP | 2006080560 A | 3/2006 |
| JP | 2006140273 A | 6/2006 |
| JP | 2017183540 A | 10/2017 |

CERAMIC CARRIER SUBSTRATE AND POWER MODULE

FIELD

The present invention relates to a ceramic carrier substrate, to a power module comprising the carrier substrate and to a method for forming the carrier substrate.

BACKGROUND INFORMATION

There is a fundamental need for electronic units of ever higher power. Operational reliability throughout service life and ever more compact construction will in future play a significant role in the competitiveness of such electronic units. In many cases, Active Metal Brazing (AMB) substrates are used for this purpose which have, for example, a ceramic core of Si3N4 and the upper and/or lower sides of which have a thick copper metallization applied by an active brazing method. Due to the major power flows involved, the thick copper metallization is essential from a thermal and an electrical standpoint. What are known as Direct Bonded Copper (DBC) substrates are likewise used for this purpose. In this case too, there is a ceramic carrier substrate, at least one side of which is firmly connected to a thick copper metallization by way of the otherwise known DBC method. Thanks to the thick copper metallization, both AMB substrates and DBC substrates have elevated electrical current-carrying capacity and robustness.

Today's LTCC multilayer technology currently used in electronic control units (e.g., in the automotive sector) is used to provide complex, multilayer circuit carriers for logic applications and optionally similar circuitry with currents in the relatively low ampere range. The conductor tracks are patterned by a screen printing method, metallic pastes being used and typical conductor track layer thicknesses of for example 3-12 μm (in the fired state) being used for logic applications. In order to be able to conduct high currents in the 3 to 4 digit ampere range, power substrates using for example DBC technology can be combined with logic substrates using for example LTCC multilayer technology and connected to one another using appropriate mounting and bonding technologies. Structurally separating logic circuit and drive circuit on different carrier substrates is costly.

SUMMARY

An object of the present invention is to harmonize the requirements of power electronics and drive electronics required for the power electronics integrally in a ceramic-based substrate technology.

This object may be achieved by a ceramic carrier substrate, a power module comprising the carrier substrate and a method for forming the carrier substrate in accordance with the present invention.

In accordance with an example embodiment of the present invention, the starting point is a ceramic carrier substrate for an electrical and/or electronic circuit, in particular an LTCC or HTCC substrate, with a plurality of ceramic layers arranged one above the other in an interconnected structure and with conductor tracks arranged on and/or in individual ceramic layers and connected to one another as the conductor structure for the electrical and/or electronic circuit. The interconnected structure is in particular formed by a firing operation. A first conductor substructure is here formed in a first interconnected structure subassembly which comprises at least one of the ceramic layers, and a second conductor substructure is formed in a second interconnected structure subassembly which is directly adjacent to the first interconnected structure subassembly and comprises at least one of the ceramic layers. The second conductor substructure here substantially, preferably exclusively, consists of high-current conductor tracks and is configured to contact a power circuit arrangeable on the outer face of the carrier substrate facing the second interconnected structure subassembly. The first conductor substructure furthermore substantially, preferably exclusively, consists of signal conductor tracks and is configured to contact a drive circuit for the power circuit, which drive circuit is arrangeable on the outer face of the carrier substrate facing toward the first interconnected structure subassembly. While the conductor structure is indeed divided into different conductor substructures and spatially arranged in different regions, the substructures are advantageously integrated in a common ceramic carrier substrate. On the one hand, any elevated evolution of heat which is to be expected during operational service of the carrier substrate is displaced substantially solely to the second interconnected structure subassembly side. The evolution of heat is the result of waste heat generated on current feed to the high-current conductor tracks, in particular at high current intensities. Any necessary heat dissipation from the carrier substrate is then simplified overall, for example by the provision of an appropriate thermally bonded heat sink on a component side of the carrier substrate which faces toward the second interconnected structure subassembly. The heat sink is in particular a heat dissipator, for example a heat dissipator with a cooling medium flowing through it. The purposeful dissipation of heat in the direction of the stated component side which is achievable in this manner additionally reduces or eliminates heating of a drive circuit arrangeable on the other component side. On the other hand, the two interconnected structure subassemblies can advantageously be handled with regard to wiring topology in the same way as single substrates which are populatable on one side, it being possible to dispense with the previous complex mounting and bonding technology for electrically connecting two otherwise separate substrates respectively for a power circuit and a drive circuit. Instead, electrical connection proceeds very simply by electrically connecting the first and the second conductor substructures to one another by way of at least one via. Forming vias is a conventional reliable manufacturing process and can for example be performed together with the application of conductor tracks by way of for example a screen printing method in advance of a firing operation of green films to yield the ceramic layers. The at least one via here in each case passes through a ceramic layer of the first and the second interconnected structure subassemblies. If required, a plurality of vias can in the same way electrically connect conductor tracks of different ceramic layers of the interconnected structure subassemblies to one another at different locations of the carrier substrate. It is also possible for vias of the same kind additionally to connect conductor tracks to one another in or on different ceramic layers within a respective interconnected structure subassembly. In general, the advantage is obtained that the vias connecting the two conductive substructures can electrically couple two circuits of differing current intensities. The arrangeable power circuit together with the second conductor substructure are here capable, for example, of forming a high-current circuit. The arrangeable drive circuit together with the first conductor substructure may furthermore form a logic circuit with a low current feed.

The measures disclosed herein enable advantageous further developments of and improvements to the electronic assembly according to the present invention.

In one advantageous embodiment of the carrier substrate of the present invention, the second conductor substructure has a many times higher current-carrying capacity than the first conductor substructure, for example more than 10 times, preferably more than 20 times, in particular up to or more than 30 times higher. Such a current-carrying capacity in particular obtains in the case of continuous current feed to the conductor substructures. Specifically, in the case of continuous current feed, the second conductor substructure has a current-carrying capacity of up to 200 amperes, preferably of up to 500 amperes, in particular of up to 600 amperes or above. The maximum current-carrying capacity for the first conductor substructure is up to 20 amperes depending on design. In the case of pulsed current feed, the current-carrying capacity can be distinctly further increased and maximized, for example in the case of pulsed current feed the second conductor substructure has a current-carrying capacity of up to 1000 amperes, preferably of up to 2000 amperes, in particular of up to 3000 amperes or above. In the case of pulsed current feed, the current has pulse lengths in the microsecond range. Depending on design, the max. current-carrying capacity in the case of pulsed loading of the first conductor substructure is up to 150 amperes, preferably up to 200 amperes, in each case with current pulse lengths in the microsecond range and up to 80 amperes, preferably up to 100 amperes in each case with current pulse lengths in the millisecond range. The current-carrying capacity of the respective conductor tracks is accordingly advantageously oriented toward and adaptable to the intended application.

In a preferred embodiment of the carrier substrate of the present invention, the high-current conductor tracks in each case have a layer thickness of 20 μm up to and including 150 μm, in particular of 40 μm up to and including 150 μm. The layer thicknesses of all the high-current conductor tracks can be identical. Alternatively, however, at least two or all of the high-current conductor tracks may also differ from one another in terms of their layer thicknesses. Depending on which current intensities have to be provided in the circuit for the specific field of application, the conductor cross-section and the material of the respective conductor track can then be specifically adapted. It is furthermore possible for the layer thicknesses of conductor tracks within the second interconnected structure subassembly to be identical in or on a ceramic layer, but to differ between the ceramic layers. In particular, conductor track layer thickness increases starting from the ceramic layer arranged closest to the first interconnected structure subassembly up to the ceramic layer arranged furthest from the first interconnected structure subassembly. In this way, in the event of current feed, the thermal energy generated during operation can be associated with appropriate heat dissipation paths as a function of the energy value thereof; conductor tracks with high currents, and thus elevated waste heat, are advantageously associated with the shortest possible heat dissipation paths.

In one particularly favorable embodiment of the carrier substrate of the present invention, the high-current conductor tracks, at least those of the second conductor substructure or those of both conductor substructures, are formed from pure silver or pure copper. In this way, the conductor tracks are advantageously of low resistance, whereby waste heat during operation can also be minimized. Alternatively, the conductor tracks are made from an alloy of the respectively above-stated materials. In addition, the conductor tracks can also alternatively be formed of tin, tungsten, molybdenum, platinum, palladium and/or the alloys or mixtures thereof in order to reduce material costs. The materials of the signal conductor tracks and of the high-current conductor tracks can in principle differ from one another. Low-resistance materials should accordingly in particular be provided for the high-current conductor tracks, while the signal conductor tracks may be made from materials which are less expensive but of higher resistance than the high-current conductor tracks.

In one further development of the carrier substrate of the present invention, the high-current conductor tracks are in each case formed from a plurality of individual layers arranged one above the other, in particular printed by a screen printing method, and connected to one another, in particular fired to one another, in an interconnected structure. The high-current conductor tracks 2 to 12 then in particular have individual layers which are connected to one another. A plurality of individual layers are here applied by multilayer technology. A subsequent layer is here applied onto a previously printed individual layer or onto a stack of individual layers, in particular by a screen printing method, until the intended total number of individual layers and/or an intended layer thickness of the high-current conductor track to be formed is reached. The layer thicknesses of all the individual layers within one or at least one or all of the high-current conductor tracks may here be identical. Alternatively, at least two or all of the individual layers within one or at least one or all of the high-current conductor tracks may differ from one another in terms of their respective layer thicknesses. In particular, the layer thicknesses of subsequently applied individual layers may be increasingly reduced, whereby the multilayer high-current conductor tracks can be formed particularly reliably. In principle, the respective or all of the high-current conductor tracks can advantageously be adapted to a required current-carrying capacity by way of the number of individual layers.

In one advantageous embodiment of the carrier substrate of the present invention, the ceramic layers within the second interconnected structure subassembly in each case have a greater layer thickness than the ceramic layers within the first interconnected structure subassembly. In particular, at least one or all of the ceramic layers within the second interconnected structure subassembly in each case has a layer thickness of greater than 150 μm to 1000 μm, in particular greater than 150 μm to 750 μm, preferably from 250 μm to 600 μm. All the ceramic layers within the second interconnected structure subassembly preferably in each case have the same layer thickness. Alternatively, the ceramic layers within the second and/or also the first interconnected structure subassembly may differ in terms of their respective layer thicknesses. The ceramic layers are advantageously specifically adapted in terms of their layer thicknesses to the conductor tracks which are to be provided with regard to the required current-carrying capacity. In principle, as the layer thickness of a ceramic layer increases, it is possible to provide high-current conductor tracks which are cross-sectionally larger, in particular taller in the thickness direction. Tried and trusted HTCC or LTCC firing processes may here, for example, be used for firing an HTCC or LTCC carrier substrate.

In order to obtain a particularly compact embodiment of the carrier substrate with a maximum high-current capacity, one embodiment of the carrier substrate of the present invention should be provided in which the high-current conductor tracks in each case fill recesses within a ceramic layer and/or are in each case impressed on one side down to a certain depth in a ceramic layer. The high-current conductor tracks in each case terminate flush with the ceramic layer or in each case protrude by at most 20 µm from the ceramic layer.

The present invention also leads to a power module comprising a carrier substrate in at least one of the above-described embodiments. A power circuit which is electrically contacted with the second conductor substructure is here arranged on the outer face of the carrier substrate facing toward the second interconnected structure subassembly. A drive circuit for the power circuit, which drive circuit is electrically contacted with the first conductor substructure is furthermore arranged on the outer face of the carrier substrate facing toward the first interconnected structure subassembly. The power circuit comprises at least one power semiconductor, in particular forming at least one B2 bridge and/or B6 bridge. The power circuit is in particular for example a rectifier, converter or inverter circuit or at least part of such a circuit. A particularly compact and powerful power module is advantageously enabled in this way.

In one advantageous embodiment of the present invention, the outer face of the carrier substrate is thermally connected on the arranged power circuit side to a heat sink, in particular to a heat dissipator, for example to a heat dissipator with a cooling medium flowing through it. Any waste heat arising on the second interconnected structure subassembly side can be very effectively dissipated from the carrier substrate by way of the heat sink. Despite high currents, it is possible to maintain a maximum admissible operating temperature of the power module, for example up to an operating temperature of 175° C., in particular of up to 200° C.

It is in principle advantageous that, during operation of the power module, logic signals for driving the power circuit are provided on connection of the drive circuit to a voltage source by way of the first conductor substructure and, on connection of the power circuit to a high-current load, a high-current circuit is formed within the second conductor substructure depending on the manner of driving. In the case of pulsed driving of the power circuit, a high-current circuit of up to 1000 amperes, preferably of up to 2000 amperes, in particular of up to 3000 amperes and above can advantageously be formed. The pulsed current here in each case has a pulse length in the microsecond range.

The present invention also provides a method for forming a carrier substrate in at least one of the above-described embodiments. In accordance with an example embodiment of the present invention, the method includes the following method steps:
 a) arranging conductor tracks on ceramic green films, in particular by a screen printing method, a conductor track material for high-current conductor tracks being applied to at least one green film and conductor track material for signal conductor tracks being applied to at least one green film,
 b) stacking green films in an assembly, solely green films comprising the signal conductor tracks being arranged one above the other in a first subassembly, and solely green films comprising the high-current conductor tracks being arranged one above the other directly adjacent to the first subassembly,
 c) firing the green films and the conductor tracks to form an interconnected structure assembly, in particular by way of an HTCC or LTCC firing method, the fired signal conductor tracks of the fired first subassembly forming the first conductor substructure within the formed first interconnected structure subassembly and the fired high-current conductor tracks in the fired second subassembly forming the second conductor substructure of the formed interconnected structure subassembly.

The signal conductor tracks and the high-current conductor tracks are substantially defined by the current-carrying capacities that can in each case be provided, as has already been explained for the carrier substrate. In particular, a high current-carrying capacity for forming high-current conductor tracks can be achieved as described by appropriate selection of a low-resistance conductor track material, by appropriate layer thicknesses or layer cross-sections and an appropriate multilayer embodiment for achieving high layer thicknesses. The conductor track material is preferably applied to the green film as a metallic paste within a screen printing method.

In a preferred embodiment of the method of the present invention, in method step a), the conductor track material for the high-current conductor tracks is introduced within at least one recess in the respective green film and the recess is at least completely filled with or without protrusion relative to the green film. Additionally or alternatively, the conductor track material for the high-current conductor tracks is applied to the respective green film so as to adjoin and protrude from the latter. In principle, a part of the conductor track material protruding relative to the green film is exposed to force in the direction of the green film using a pressure device, such that the high-current conductor track to be formed is impressed flush or with a maximum protrusion of up to 20 µm by displacement of material within the yielding green film. In the unfired state, the green films are very soft, in particular distinctly softer than the applied conductor track material. For this reason, when the conductor track material previously applied to the green film to adjoin the latter and stand proud therefrom is exposed to force, the material of the green film is displaced partially in the thickness direction in such a way that the conductor track in each case formed by the applied conductor track material can then be impressed to a certain depth within the green film while also not undergoing any substantial change in shape. On further exposure to force, on the other hand, the conductor track material introduced into a recess in a green film and protruding above the green film may be reduced from its original layer thickness by being flattened. Flattening here results in partial lateral material displacement of the soft green film.

A firing process, in particular in the form of a sintering process, in principle results in (sintering) shrinkage of the green films and of the conductor track material applied before firing, in particular in shrinkage of up 50% of the original material volume.

BRIEF DESCRIPTION OF THE DRAWINGS

Further advantages, features and details of the present invention are revealed by the following description of preferred exemplary embodiments made with reference to the figures.

DETAILED DESCRIPTION OF EXAMPLE EMBODIMENTS

In the figures, functionally identical components are in each case denoted with the same reference signs.

Figure 1:
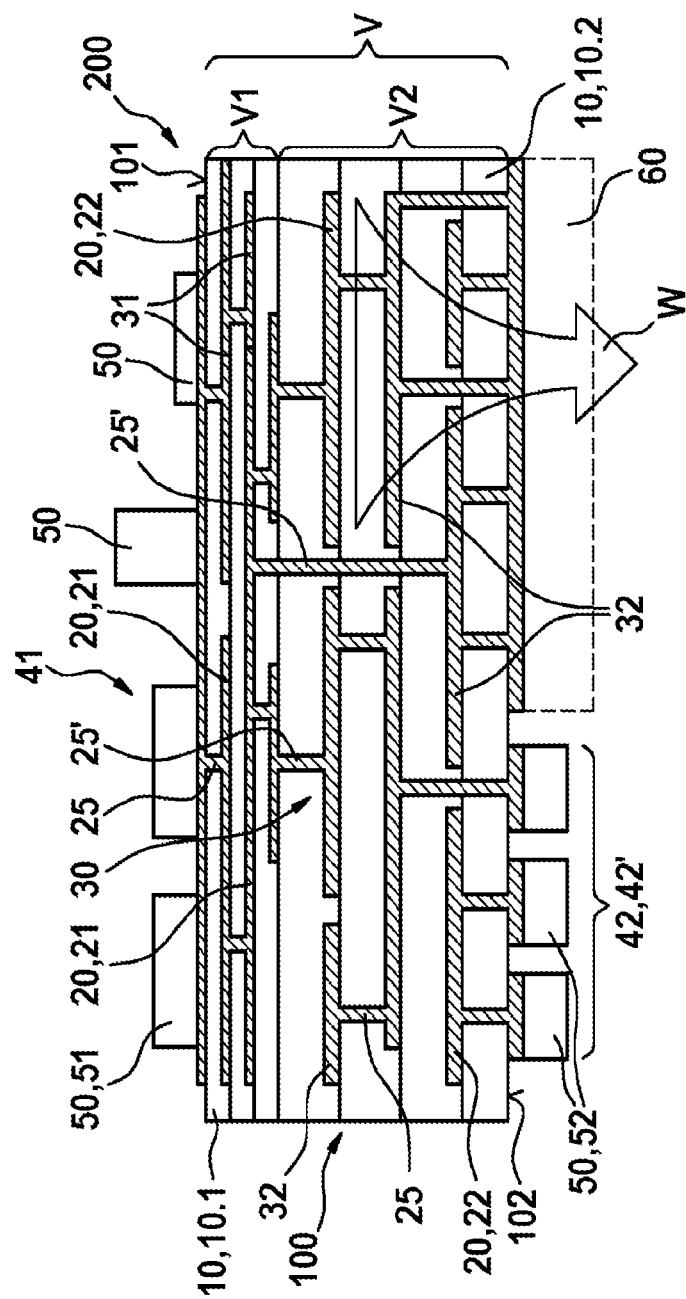
FIG. 1 is a schematic sectional representation of a power module comprising a ceramic carrier substrate with a power circuit arranged on one side and, arranged on the opposite side, a drive circuit for the power circuit, in accordance with an example embodiment of the present invention.

FIG. 1 shows a schematic sectional representation of a power module 200. The power module 200 comprises a ceramic carrier substrate 100 which has a number of ceramic layers 10 arranged one above the other in an interconnected structure V. Conductor tracks 20, which form a conductor structure 30 of the ceramic carrier substrate 100, are in each case arranged on or in the ceramic layers 10. The ceramic carrier substrate 100 furthermore has a first and a second outer face 101, 102 in each case populatable with electrical and/or electronic components 50. A power circuit 42 is accordingly then for example arranged on the second outer face 102. The power circuit in particular includes at least one power semiconductor 52. A plurality of power semiconductors 50 are, for example, interconnected to form a B2 bridge or a B6 bridge. The power circuit 42 is for example a rectifier, converter or inverter circuit 42' by way of which a high-current circuit of the power module 200 is operated. On the opposite side to the second outer face 102, a plurality of electrical and/or electronic components 50, in particular at least one logic component 51, which are interconnected to form a drive circuit 41 for the power circuit 42, are arranged on the first outer face 101 of the ceramic carrier substrate 100. The ceramic carrier substrate 100 is here adapted by specially embodied substrate regions to the requirements both of the power circuit 42 and of the drive circuit 41. On the side facing toward the first outer face 101, a first conductor substructure 31 is formed to this end in a first interconnected structure subassembly V1 comprising at least one of the ceramic layers 10, 10.1. The first conductor substructure 31 is here substantially, in particular exclusively, formed from signal conductor tracks 21. In the present exemplary embodiment, such signal conductor tracks 21 are arranged in or on three ceramic layers 10.1, with the first interconnected structure subassembly V1 naturally possibly including more or fewer ceramic layers 10.1 depending on the application. Signal conductor tracks 21, which are associated with different ceramic layers 10.1, can be electrically connected to one another across one or more layers by way of vias 25 to form the first conductor substructure 31. Conductor substructure 31 is here configured and designed as part of the drive circuit 41. In particular, the conductor cross-sections of the signal conductor tracks 21 and their current-carrying capacity may for example be kept in a low range. The current-carrying capacity of the first conductor substructure 31 is typically designed to be 20 amperes in the case of continuous current feed. The signal conductor tracks 21 furthermore preferably have layer thicknesses of 3 µm to at most 15 µm.

In contrast, on the side facing toward the second outer face 102, a second conductor substructure 32 is formed in a second interconnected structure subassembly V2 comprising at least one of the ceramic layers 10, 10.2. The second conductor substructure 32 is here substantially, in particular exclusively, formed from high-current conductor tracks 22. In the present exemplary embodiment, such high-current conductor tracks 22 are arranged in or on four ceramic layers 10.2, with the second interconnected structure subassembly V2 naturally possibly including more or fewer ceramic layers 10.2 depending on the application. High-current conductor tracks 22, which are associated with different ceramic layers 10.2, can be electrically connected to one another across one or more layers by way of vias 25 to form the second conductor substructure 32. The second conductor substructure 32 is here configured and designed as part of the power circuit 42. In particular, the conductor cross-sections of the high-current conductor tracks 22 and their current-carrying capacity may for example be kept in a high range. In comparison with the first conductor substructure 31, the second conductor substructure 32 has a many times higher current-carrying capacity, for example in the case of continuous current feed more than 10 times, preferably more than 20 times, in particular up to or more than 30 times higher. The current-carrying capacity of the second conductor substructure 32 is in particular designed to be up to 200 amperes, preferably up to 500 amperes, in particular up to 600 amperes or above. In the case of pulsed current feed, in particular by the drive circuit 41, the second conductor substructure 32 even has a current-carrying capacity of up to 3000 amperes. To this end, the high-current conductor tracks 32 have layer thicknesses of 20 µm-150 µm, which is distinctly thicker than the layer thicknesses of the signal conductor tracks 21. In addition, the high-current conductor tracks 32 are formed of a very low-resistance material, in particular of pure silver or pure copper. Alternatively, they can be made of an alloy of the respective above-stated materials. Due to the different layer thicknesses of signal conductor tracks 21 and high-current conductor tracks 22, the layer thicknesses of the ceramic layers 10, 10.1, 10.2 also differ depending on whether they belong to the first or to the second interconnected structure subassembly V1, V2. While the ceramic layers 10.1 in the first interconnected structure subassembly V1 have a layer thickness of 100 µm up to and including 150 µm, the ceramic layers 10.2 of the second interconnected structure subassembly should be provided with layer thicknesses of over 150 µm up to and including 1000 µm.

The first and the second conductor substructures 31, 32 are in principle connected to one another by way of at least one via 25', such that the latter also electrically interconnects the drive circuit 41 and the power circuit 42 to one another. The via 25' here passes through at least one ceramic layer 10, 10.1, 10.2 of the first and the second interconnected structure subassemblies V1, V2. During operation of the power module 200, logic signals for driving the power circuit 42 are provided on connection of the drive circuit 41 to a voltage source (not shown) by way of the first conductor substructure 31. This proceeds by low continuous drive currents of up to 20 amperes. In contrast, on connection of the power circuit 42 to a high-current load (not shown) a high-current circuit is formed within the second conductor substructure 32 depending on the manner of driving. Waste heat which arises due to the high-current circuit on the high-current conductor tracks 22 can be dissipated as a thermal flux W through the second interconnected structure subassembly V2 to a heat sink 60 arranged on the second outer face 102. The heat sink 60 is in particular a heat dissipator which is brazed, for example with a metallization, and thus thermally bonded to the second outer face 102. In order to bring about a high heat dissipation capacity, the heat dissipator may preferably have a cooling medium, for example water, flowing through it.

The carrier substrate 100 or the power module 200 is formed as follows. In a first method step, conductor tracks 20 are applied to ceramic green films by a screen printing method. Accordingly, for example for an embodiment as shown in FIG. 1, signal conductor tracks 21 are applied with a metallic paste to three green films. High-current conductor tracks 22 are applied to a further four green films using the same metallic paste 20' or another, in particular low-resistance, metallic paste, preferably of pure silver or pure copper. Both the layer thicknesses of the green films and the layer thicknesses of the conductor tracks 20 differ depending on whether signal conductor tracks 21 or high-current conductor tracks 22 are to be applied.

Figure 2A:
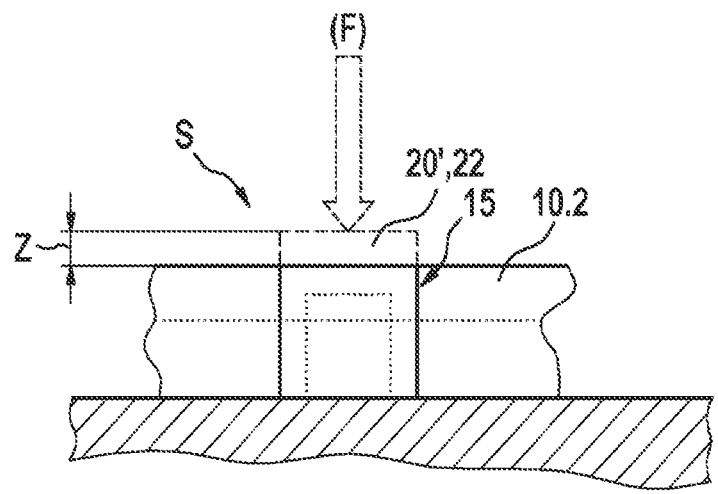
FIG. 2A is a sectional detail representation of a possible arrangement of a high-current conductor track in a green film before a firing operation, in accordance with an example embodiment of the present invention.
Figure 2B:
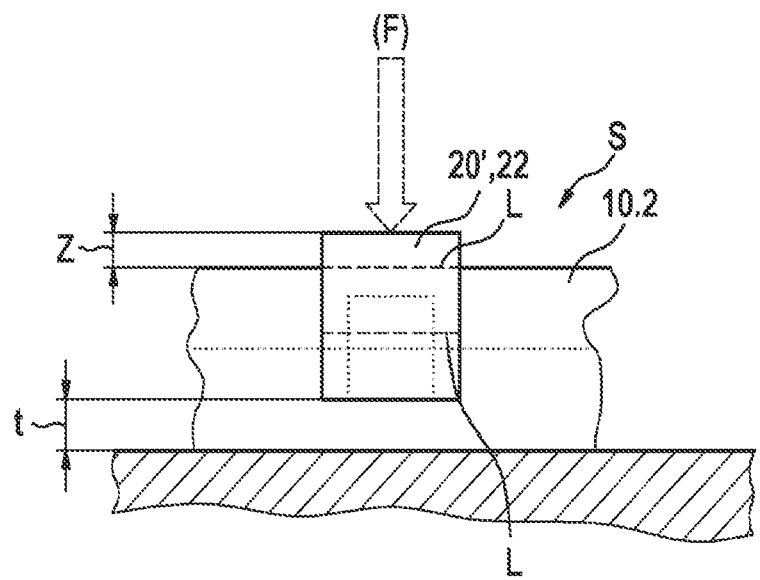
FIG. 2B is a sectional detail representation of a further possible arrangement of a high-current conductor track in a green film before a firing operation, in accordance with an example embodiment of the present invention.

FIGS. 2A and 2B in each case schematically show a method state indicating how the high-current conductor tracks 22 can be differently arranged in or on a green film on application. The state after a firing operation, in which green films and applied high-current conductor tracks 22 undergo shrinkage of up to 50% of their original volume, is shown in dashed lines. The two figures show a detail of an arbitrary section through the green film and the applied high-current conductor track 22. In a first possibility according to FIG. 2A, the green film has a recess 15 which, on application of the metallic paste 20' with or without a protrusion Z relative to the green film, is completely filled from the application side S. In an alternative embodiment, a conductor track material is applied from an application side S onto the planar green film. A plurality of layers L in a stack arrangement can here also form a layer thickness of the high-current conductor track 22, for example up to 12 layers L. Thereupon, the applied high-current conductor track 22 is exposed from the application side S to a force F with a pressure device in the direction of the green film support. Since the green film is softer than the conductor track material 20', the applied high-current conductor track 22 is impressed by means of the force F into the green film down to a certain depth t, as shown in FIG. 2B. On impression, green film material is partially displaced in the depth direction. After impression, the high-current conductor track 22 terminates flush with the green film on the application side S or exhibits a protrusion Z. A protrusion Z in the embodiment according to FIG. 2A may, on the other hand, be reduced by acting, in comparable manner to FIG. 2B, with a force F on the high-current conductor track 22. The high-current conductor track 22 is here flattened, the material of the green film being partially laterally displaced.

Once conductor tracks 20, 21, 22 have been applied, the green films are placed in a stack arrangement. A first subassembly is firstly formed solely with the green films comprising the signal conductor tracks 21. Directly adjacent to the first subassembly, solely green films comprising the high-current conductor tracks 22 are arranged one above the other in a second subassembly. The stack arrangement is then fired by a firing method, in particular using an HTCC or LTCC firing method. This gives rise to the interconnected structure V of a plurality of fired ceramic layers 10, 10.1, 10.2. Furthermore, the first conductor substructure 31 is formed by the fired signal conductor tracks 21 and the second conductor substructure 32 by the fired high-current conductor tracks 22. The resultant ceramic carrier substrate 10 is preferably an HTCC or an LTCC substrate. The first and the second outer faces 101, 102 can then be populated with electrical and electronic components 50 and connected for example by a brazing or sintering method. The first outer face 101 in particular has a connection scheme for at least one logic component 102. The second outer face, on the other hand, has a connection scheme for at least one power semiconductor 52. All in all, the power circuit 42 is formed on the second outer face 102 side and the drive circuit 41 of the power circuit 42 on the first outer face 101 side. Together they form, with the carrier substrate 10, the power module 200.

What is claimed is:

1. A ceramic carrier substrate for an electrical and/or electronic circuit, comprising:
   a plurality of ceramic layers arranged one above the other in an interconnected structure and with conductor tracks arranged on and/or in individual ceramic layers and connected to one another as a conductor structure for the electrical and/or electronic circuit;
   a first conductor substructure formed in a first interconnected structure subassembly of the interconnected structure, the first interconnected structure assembly including at least one ceramic layer of the plurality of ceramic layers; and
   a second conductor substructure formed in a second interconnected structure subassembly of the interconnected structure, the second interconnected structure being directly adjacent to the first interconnected structure subassembly and including at least one ceramic layer of the plurality of ceramic layers;
   wherein the second conductor substructure substantially consists of high-current conductor tracks and being configured to contact a power circuit, the power circuit being arrangeable on an outer face of the carrier substrate facing the second interconnected structure subassembly; and
   wherein the first conductor substructure substantially consists of signal conductor tracks and is configured to contact a drive circuit for the power circuit, the drive circuit being arrangeable on an outer face of the carrier substrate facing the first interconnected structure subassembly.

2. The ceramic carrier substrate as recited in claim 1, wherein the ceramic carrier substrate is an LTCC or HTCC substrate.

3. The ceramic carrier substrate as recited in claim 1, wherein the first and the second conductor substructures are electrically connected to one another by way of at least one via, each via passing through at least one ceramic layer of the first and the second interconnected structure subassemblies.

4. The ceramic carrier substrate as recited in claim 1, wherein the second conductor substructure has a many times higher current-carrying capacity than the first conductor sub structure.

5. The ceramic carrier substrate as recited in claim 1, wherein the second conductor substructure has more than 10 times higher current-carrying capacity than the first conductor substructure for example more than 10 times.

6. The ceramic carrier substrate as recited in claim 1, wherein the second conductor substructure has, in the case of continuous current feed, a current-carrying capacity of up to 200 amperes, and/or, in the case of pulsed current feed, a current-carrying capacity of up to 1000 amperes.

7. The ceramic carrier substrate as recited in claim 1, wherein the second conductor substructure has, in the case of continuous current feed, a current-carrying capacity of up to 500 amperes, and/or, in the case of pulsed current feed, a current-carrying capacity of up to 2000 amperes.

8. The ceramic carrier substrate as recited in claim 1, wherein the high-current conductor tracks each have a layer thickness of 20 μm up to and including 150 μm.

9. The ceramic carrier substrate as recited in claim 1, wherein the high-current conductor tracks are formed from pure silver, or pure copper or an alloy of silver or an allow of copper.

10. The ceramic carrier substrate as recited in claim 1, wherein the high-current conductor tracks are each formed from a plurality of individual layers arranged one above the other, by a screen printing method, and fired to one another in an interconnected structure with 2 to 12 individual layers connected to one another.

11. The ceramic carrier substrate as recited in claim 1, wherein each of the at least one ceramic layer within the second interconnected structure subassembly has a greater layer thickness than each of the at least one ceramic layer within the first interconnected structure subassembly.

12. The ceramic carrier substrate as recited in claim 1, wherein each of the at least one ceramic layers of the second interconnect structure subassembly has a layer thickness of greater than 150 μm to 1000 μm.

13. The ceramic carrier substrate as recited in claim 1, wherein the high-current conductor tracks fill recesses within a ceramic layer and/or are impressed on one side down to certain a depth in a ceramic layer, each of the high-current conductor tracks terminating flush with the ceramic layer or protruding by at most 20 μm from the ceramic layer.

14. A power module, comprising:
a carrier substrate including:
   a plurality of ceramic layers arranged one above the other in an interconnected structure and with conductor tracks arranged on and/or in individual ceramic layers and connected to one another as a conductor structure for the electrical and/or electronic circuit,
   a first conductor substructure formed in a first interconnected structure subassembly of the interconnected structure, the first interconnected structure assembly including at least one ceramic layer of the plurality of ceramic layers, and
   a second conductor substructure formed in a second interconnected structure subassembly of the interconnected structure, the second interconnected structure being directly adjacent to the first interconnected structure subassembly and including at least one ceramic layer of the plurality of ceramic layers,
   wherein the second conductor substructure substantially consists of high-current conductor tracks, and
   wherein the first conductor substructure substantially consists of signal conductor tracks;
a power circuit including at least one power semiconductor, the power circuit being electrically contacted with the second conductor substructure and being arranged on an outer face of the carrier substrate facing the second interconnected structure subassembly; and
a drive circuit for the power circuit, the drive circuit being electrically contacted with the first conductor substructure and being arranged on an outer face of the carrier substrate facing the first interconnected structure subassembly.

15. The power module as recited in claim 14, wherein the outer face of the carrier substrate is thermally connected on the arranged power circuit side to a heat sink, the heat sink being a heat dissipator with a cooling medium flowing through it.

16. The power module as recited in claim 14, wherein, during operation, logic signals for driving the power circuit are provided on connection of the drive circuit to a voltage source by way of the first conductor substructure and, on connection of the power circuit to a high-current load, a high-current circuit is formed within the second conductor substructure depending on the manner of driving.

17. The power module as recited in claim 14, wherein, in the case of pulsed driving of the power circuit, a high-current circuit of up to 1000 amperes up to 3000 amperes is formed.

18. A method for forming a carrier substrate, comprising the following steps:
   a) arranging conductor tracks on ceramic green films by a screen printing method, a conductor track material for high-current conductor tracks being applied to at least one respective green film of the green films and conductor track material for signal conductor tracks being applied to at least one respective green film of the green files;
   b) stacking the green films in an assembly, solely those of the green films including the signal conductor tracks being arranged one above the other in a first subassembly, and solely those of the green films including the high-current conductor tracks being arranged one above the other directly adjacent to the first subassembly,
   c) firing the green films and the conductor tracks to form an interconnected structure assembly by way of an HTCC or LTCC firing method, the fired signal conductor tracks of the fired first subassembly forming the first conductor substructure within the formed first interconnected structure subassembly and the fired high-current conductor tracks in the fired second subassembly forming the second conductor substructure of the formed interconnected structure subassembly.

19. The method as recited in claim 18, wherein, in step a): (i) the conductor track material for the high-current conductor tracks is introduced within at least one recess in the respective green film and the recess is at least completely filled with or without protrusion relative to the respective green film, and/or (ii) the conductor track material for the high-current conductor tracks is applied to the respective green film so as to adjoin and protrude from the respective green film, a part of the conductor track material protruding relative to the respective green film being exposed to force in a direction of the respective green film using a pressure device, such that the high-current conductor track to be formed is impressed flush or with a maximum protrusion of up to 20 μm by displacement of material within the respective green film.

* * * * *